United States Patent
Jang et al.

(10) Patent No.: US 12,341,097 B2
(45) Date of Patent: Jun. 24, 2025

(54) SEMICONDUCTOR DEVICES

(71) Applicant: Samsung Electronics Co., Ltd., Suwon-si (KR)

(72) Inventors: Sangshin Jang, Seoul (KR); Wookyung You, Hwaseong-si (KR); Sangkoo Kang, Yongin-si (KR); Donghyun Roh, Suwon-si (KR); Koungmin Ryu, Hwaseong-si (KR); Jongmin Baek, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 534 days.

(21) Appl. No.: 17/720,571

(22) Filed: Apr. 14, 2022

(65) Prior Publication Data
US 2023/0059177 A1 Feb. 23, 2023

(30) Foreign Application Priority Data
Aug. 19, 2021 (KR) .................. 10-2021-0109247

(51) Int. Cl.
*H01L 23/528* (2006.01)
*H01L 23/532* (2006.01)
*H01L 21/768* (2006.01)

(52) U.S. Cl.
CPC .... *H01L 23/5283* (2013.01); *H01L 23/53223* (2013.01); *H01L 23/53238* (2013.01);
(Continued)

(58) Field of Classification Search
CPC ............ H01L 23/481; H01L 23/48; H01L 23/5283; H01L 23/53223; H01L 23/53238;
(Continued)

(56) References Cited

U.S. PATENT DOCUMENTS 6,096,632 A 8/2000 Drynan
6,171,763 B1 1/2001 Wang et al.
(Continued)

FOREIGN PATENT DOCUMENTS

KR 1998-081322 A 11/1998
KR 2000-0044863 A 7/2000
(Continued)

*Primary Examiner* — Natalia A Gondarenko
(74) *Attorney, Agent, or Firm* — Harness, Dickey & Pierce, P.L.C.

(57) ABSTRACT

A semiconductor device including a first conductive layer on a substrate, a second conductive layer on the first conductive layer, a contact structure between the first and second conductive layers, and a barrier structure surrounding a lower region of a side surface of the second conductive layer, wherein the contact structure includes a contact conductive layer having a first upper surface portion and a second upper surface extending from the first upper surface portion and being concave, and a gap-fill pattern fills a space between the second upper surface portion and the second conductive layer and includes a first gap-fill insulating layer including a metal element and a second gap-fill insulating layer including a silicon element, and the barrier structure includes a first etch stop layer and a barrier layer that include same materials as the first insulating material and the second insulating material, respectively, may be provided.

19 Claims, 14 Drawing Sheets

(52) U.S. Cl.
CPC ............... *H01L 23/53266* (2013.01); *H01L 23/53295* (2013.01); *H01L 21/76832* (2013.01); *H01L 21/76877* (2013.01)

(58) Field of Classification Search
CPC ........... H01L 23/53266; H01L 23/5384; H01L 23/53295; H01L 23/5226; H01L 21/743; H01L 21/76832; H01L 21/76834; H01L 21/7684; H01L 21/76898; H01L 21/76808; H01L 21/76816; H01L 21/76877–76883; H01L 21/76831; H01L 21/76889; H01L 2221/1063; H01L 2924/0002; H01L 2029/7858; H01L 2225/06541; H01L 2225/06544; H01L 2224/05085–05098; H01L 2224/8203–82047; H01L 2224/18–255; H01L 2223/6616–6622; H01L 24/18–25; H01L 24/83; H01L 2221/101–1036; H01L 21/32133; H01L 21/823871; H01L 21/823475; H01L 21/486; H01L 21/02063; H01L 21/4846; H01L 21/4867; H01L 21/31111; H01L 21/7682; H01L 21/76897; H10B 12/0335; H10B 12/053; H10B 12/485; H10B 12/482; H10B 63/10; H10B 63/20; H10B 63/22; H10B 61/10; H10B 61/20
USPC ................ 438/618, 692, 633, 693; 257/751
See application file for complete search history.

(56) References Cited

U.S. PATENT DOCUMENTS

| | | | |
|---|---|---|---|
| 10,658,180 | B1 | 5/2020 | Mignot et al. |
| 2007/0218684 | A1 | 9/2007 | Kim |
| 2014/0048939 | A1* | 2/2014 | Park .................. H01L 21/76852 438/653 |
| 2014/0061917 | A1* | 3/2014 | Kim ....................... H01L 23/485 257/751 |
| 2014/0106574 | A1 | 4/2014 | Kang et al. |
| 2015/0056803 | A1 | 2/2015 | Chandrashekar et al. |
| 2019/0214296 | A1* | 7/2019 | Wang ................ H01L 21/76876 |
| 2020/0272045 | A1 | 8/2020 | Felix et al. |
| 2020/0273705 | A1 | 8/2020 | Singh et al. |
| 2020/0273805 | A1* | 8/2020 | Wu ......................... H01L 24/17 |
| 2021/0375677 | A1* | 12/2021 | Wang ................. H01L 27/0924 |
| 2022/0359373 | A1* | 11/2022 | Wu .................... H01L 21/76849 |
| 2022/0415790 | A1* | 12/2022 | Clevenger ........... H01L 23/5226 |

FOREIGN PATENT DOCUMENTS

| | | |
|---|---|---|
| KR | 2002-0071349 A | 9/2002 |
| KR | 2003-0097493 A | 12/2003 |
| KR | 10-0841049 B1 | 1/2004 |
| KR | 2005-0052105 A | 6/2005 |
| KR | 2007-0036204 A | 4/2007 |
| KR | 10-0831981 B1 | 9/2007 |
| WO | WO-2020/190941 A1 | 9/2020 |

* cited by examiner

SEMICONDUCTOR DEVICES

CROSS-REFERENCE TO RELATED APPLICATION

This application claims benefit of priority to Korean Patent Application No. 10-2021-0109247 filed on Aug. 19, 2021 in the Korean Intellectual Property Office, the disclosure of which is incorporated herein by reference in its entirety.

BACKGROUND

The present inventive concepts relate to semiconductor devices.

As the demand for high performance, high speed and/or multifunctionality of semiconductor devices, or the like, increases, a degree of integration of semiconductor devices is increasing. According to a trend for high integration of semiconductor devices, a size of a transistor may be reduced, and a size of wiring layers and contacts electrically connected to a reduced size of the transistor are also reduced. Accordingly, various studies are being conducted for stable connection of wiring layers and contacts.

SUMMARY

An aspect of the present inventive concepts is to provide a semiconductor device having improved reliability.

According to an aspect of the present inventive concepts, a semiconductor device may include a first conductive layer on a substrate, a second conductive layer on the first conductive layer, a contact structure between the first conductive layer and the second conductive layer, and a barrier structure surrounding a lower region of a side surface of the second conductive layer, wherein the contact structure includes a contact conductive layer and a gap-fill pattern, the contact conductive layer having an upper surface that includes a first portion in contact with the second conductive layer and a second portion extending from the first portion of the upper surface and being concave with respect to the substrate, the gap-fill pattern filling a space between the second portion of the upper surface of the contact conductive layer and the second conductive layer, the gap-fill pattern including a plurality of layers, wherein at least one of the plurality of layers of the gap-fill pattern conformally covers the second portion of the upper surface of the contact conductive layer, wherein the plurality of layers of the gap-fill pattern include a first gap-fill layer and a second gap-fill layer, the first gap-fill layer including a first insulating material that includes a metal element, the second gap-fill layer including a second insulating material that includes a silicon element, wherein the barrier structure includes a first etch stop layer and a barrier layer, the first etch stop layer including a same material as the first insulating material, the barrier layer including a same material as the second insulating material.

According to an aspect of the present inventive concepts, a semiconductor device may include an insulating layer on a substrate, and having a contact hole, a contact structure in the contact hole of the insulating layer, a conductive layer on the contact structure, and a barrier structure in contact with a lower region of a side surface of the conductive layer, and spaced apart from the contact structure, wherein the contact structure includes a contact conductive layer and a gap-fill pattern, the contact conductive layer having a recess being concave with respect to the substrate, an upper surface of the contact conductive layer in contact with the conductive layer, the gap-fill pattern in the recess of the contact conductive layer and in contact with the conductive layer, the gap-fill pattern including a plurality of layers, wherein a lower surface of the conductive layer includes a first portion in contact with the upper surface of the contact conductive layer, and a second portion in contact with an upper surface of the insulating layer, wherein the first portion is at a higher level than the second portion, wherein the plurality of layers of the gap-fill pattern includes a first gap-fill layer and a second gap-fill layer, the first gap-fill layer including a first insulating material that includes a metal element, the second gap-fill layer including a second insulating material that includes a silicon element, and wherein the barrier structure includes a first etch stop layer and a barrier layer, the first etch stop layer including a same material as the first insulating material, the barrier layer including a same material as the second insulating material.

According to an aspect of the present inventive concepts, a semiconductor device may include a first insulating layer on a substrate, a first conductive layer penetrating through the first insulating layer, a second insulating layer on the first insulating layer and the first conductive layer, a contact structure directly connected to the first conductive layer and penetrating through the second insulating layer, a third insulating layer on the second insulating layer and the contact structure, a second conductive layer directly connected to the contact structure and penetrating through the third insulating layer, and a barrier structure between the second insulating layer and the third insulating layer, in contact with a lower region of a side surface of the second conductive layer, and spaced apart from the contact structure, wherein the contact structure includes a contact conductive layer and a gap-fill pattern, the contact conductive layer having an upper surface that includes a first upper surface in contact with the second conductive layer and a second portion extending from the first portion of the upper surface and being concave with respect to the substrate, the gap-fill pattern filling a space between the second portion of the upper surface of the contact conductive layer and the second conductive layer, the gap-fill pattern including a plurality of layers, wherein the plurality of layers of the gap-fill pattern includes a first gap-fill layer and a second gap-fill layer, the first gap-fill layer including a first insulating material that includes a metal element, the second gap-fill layer including a second insulating material that includes a silicon element, a third gap-fill layer including a same material as the first insulating material, wherein the barrier structure includes a first etch stop layer, a barrier layer and a second etch stop layer, the first etch stop layer including a same material as the first insulating material, the barrier layer including a same material as the second insulating material, the second etch stop layer including a same material as the first insulating material, wherein the first gap-fill layer conformally covers the second portion of the upper surface of the contact conductive layer, wherein the second gap-fill layer conformally covers the first gap-fill layer, wherein the second insulating material includes at least one of SiCO, SiCN, SiCOH, and SiCON, wherein the metal element includes at least one of aluminum (Al), zirconium (Zr), hafnium (Hf), titanium (Ti), ruthenium (Ru), molybdenum (Mo), tungsten (W), copper (Cu), and cobalt (Co).

According to an aspect of the present inventive concepts, a method of manufacturing a semiconductor device may include: forming a first insulating layer and a first conductive layer on a substrate; forming a second insulating layer having a contact hole on the first conductive layer; forming a conductive material layer having a void on the contact hole and the second insulating layer; forming a contact conductive layer by partially removing the conductive material layer on the second insulating layer by performing a planarization process; forming a plurality of insulating layers on the contact conductive layer and the second insulating layer; forming a third insulating layer having a trench on the plurality of insulating layers; partially removing the plurality of insulating layers exposed to the trench by performing a strip process and an etching process at least once, respectively; and forming a second conductive layer connected to the contact conductive layer in the trench, wherein, when the conductive material layer is deposited, the void, downwardly concave from an upper surface thereof, is formed in the conductive material layer, at least a portion of the plurality of insulating layers are formed to fill the void, the plurality of insulating layers include a first layer including a first insulating material including a metal element, and a second layer including a second insulating material including a silicon element, the second layer conformally covering the first layer, wherein, as the plurality of insulating layers are partially removed, the first layer may partially remain in the void to form a first gap-fill layer, and may partially remain on the second insulating layer to form a first etch stop layer, wherein, as the plurality of insulating layers are partially removed, the second layer may partially remain on the first gap-fill layer in the void to form a second gap-fill layer, and may partially remain on the first etch stop layer to form a barrier layer.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, some example embodiments of the present inventive concepts will be described with reference to the accompanying drawings.

Expressions such as "at least one of," when preceding a list of elements, modify the entire list of elements and do not modify the individual elements of the list. Thus, for example, both "at least one of A, B, and C" and "A, B, and/or C" means either A, B, C or any combination thereof.

While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

Figure 1:
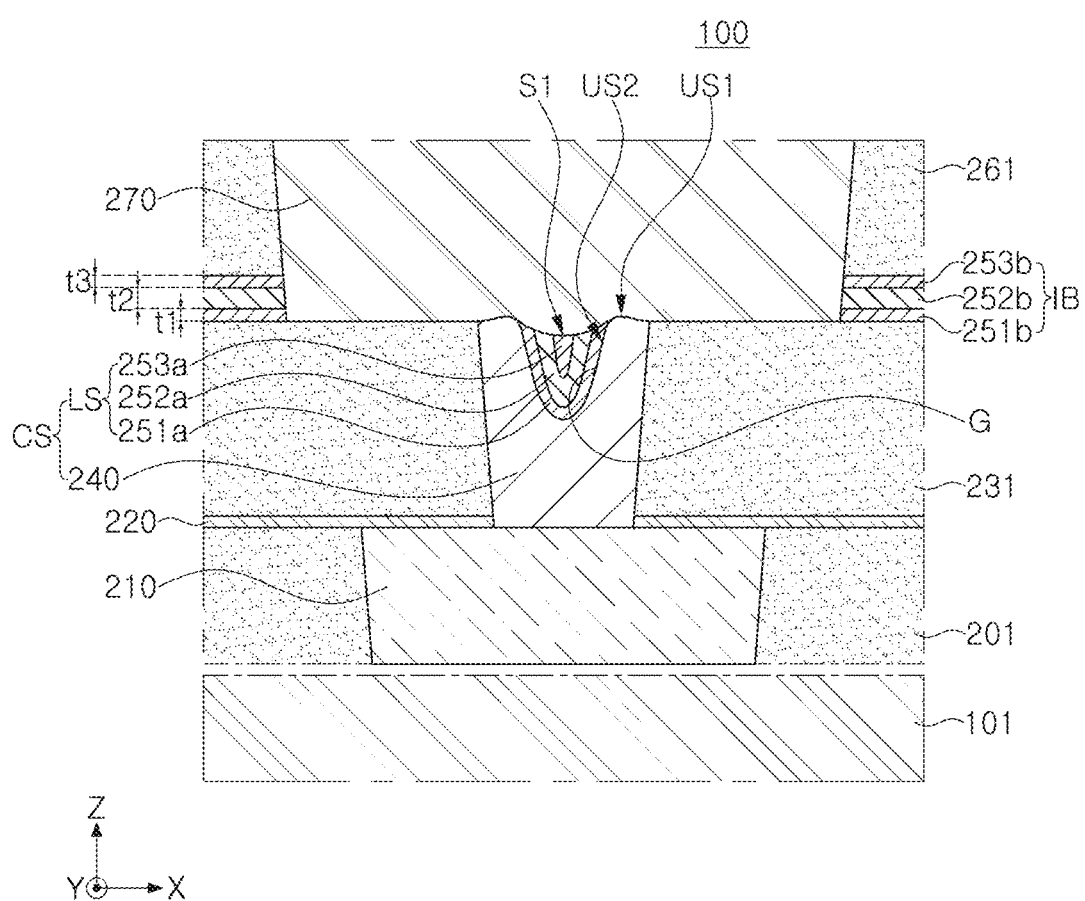
FIG. 1 is a cross-sectional view illustrating a semiconductor device according to some example embodiments.

Referring to FIG. 1, a semiconductor device 100 may include a substrate 101, a first insulating layer 201 on the substrate 101, a first conductive layer 210 penetrating through the first insulating layer 201, a lower etch stop layer 220 on the first insulating layer 201, a second insulating layer 231 on the lower etch stop layer 220, a contact structure CS penetrating through the second insulating layer 231, a barrier structure IB on the second insulating layer 231, a third insulating layer 261 on the barrier structure IB, and a second conductive layer 270 penetrating through the third insulating layer 261 and the barrier structure IB.

The substrate 101 may include a semiconductor material, such as a Group IV semiconductor, a Group III-V compound semiconductor, or a Group II-VI compound semiconductor. For example, the group IV semiconductor may include silicon (Si), germanium (Ge), or silicon germanium (SiGe). The substrate 101 may be provided as a bulk wafer, an epitaxial layer, a silicon-on-insulator (SOI) layer, a semiconductor on insulator (SeOI) layer, or the like. Transistors constituting an integrated circuit may be disposed on the substrate 101, and the transistors may be disposed in an omitted region between the substrate 101 and the first insulating layer 201.

The transistors constituting the integrated circuit may include a planar Metal Oxide Semiconductor FET (MOSFET), a FinFET in which an active region has a fin structure, and a Multi-Bridge Channel FET (MBCFET™) or a Gate-All-Around transistor including a plurality of channels vertically stacked on the active region, or a vertical FET (VFET), but the present inventive concepts are not limited thereto. The integrated circuit may include a volatile memory device such as DRAM and static RAM (SRAM), and a nonvolatile memory device such as PRAM, MRAM, ReRAM, and a flash memory device.

The first insulating layer 201 may be disposed on the substrate 101. The first insulating layer 201 may cover a side surface of the first conductive layer 210. The first insulating layer 201 may be formed of silicon oxide or a layer of a low-k insulating material having a dielectric constant lower than that of silicon oxide. For example, the first insulating layer 201 may include a low-k insulating material such as SiOCH or SiOC. For example, the first insulating layer 201 may include a material such as phosphor silicate glass (PSG), boro-phosphor silicate glass (BPSG), undoped silicate glass (USG), tetra ethyl ortho silicate (TEOS), or plasma enhanced-PEOS (PE-TEOS). TEOS), high density plasma-chemical vapor deposition (HDP-CVD) oxide, and the like.

The first conductive layer 210 may be disposed on the substrate 101 and the integrated circuit. The first conductive layer 210 may have a line shape extending in a first direction, for example, an X direction in a plan view. The first conductive layer 210 may include a plurality of first conductive layers 210 disposed to be spaced apart from each other in a second direction, perpendicular to the first direction, for example, a Y direction. The X direction and the Y direction may be directions parallel to an upper surface of the substrate 101, respectively. The first conductive layer 210 may be formed by forming a first insulating layer 201 and patterning the same, and then filling the first insulating layer 201 with a metal material layer. The first conductive layer 210 may include at least one of a metallic material, for example, tungsten (W), aluminum (Al), copper (Cu), ruthenium (Ru), molybdenum (Mo), and cobalt (Co).

A lower etch stop layer 220 may be disposed between the first insulating layer 201 and the second insulating layer 231. The lower etch stop layer 220 may include at least one of a silicon oxide, a silicon nitride, and a silicon oxynitride, or may include at least one of a metal oxide and/or a metal nitride, wherein the metal may include at least one of aluminum (Al), zirconium (Zr), hafnium (Hf), titanium (Ti), ruthenium (Ru), molybdenum (Mo), tungsten (W), copper (Cu), and cobalt (Co). The lower etch stop layer 220 may include a single layer, but the present inventive concepts are not limited thereto and may include a plurality of layers.

A second insulating layer 231 may be disposed on the first insulating layer 201. The second insulating layer 231 may cover a side surface of the contact structure CS. The second insulating layer 231 may be formed of silicon oxide or a low-k insulating material layer, and may be formed of the same material as the material constituting the first insulating layer 201.

A contact structure CS may penetrate through the second insulating layer 231 and the lower etch stop layer 220 to be directly connected to an upper portion of the first conductive layer 210. The contact structure CS may be directly connected to a lower portion of the second conductive layer 270. The contact structure CS may be a via disposed between the first conductive layer 210 and the second conductive layer 270 to electrically connect them to each other. The contact structure CS may have any one of a polygonal shape, a square shape, a rectangular shape, a rounded square shape, a circle, and an ellipse in a plan view.

The contact structure CS may include a contact conductive layer 240 having a recess G and a gap-fill pattern LS including a plurality of layers disposed in the recess G of the contact conductive layer 240. The plurality of layers of the gap-fill pattern LS may include a first gap-fill layer 251a on the contact conductive layer 240, a second gap-fill layer 252a on the first gap-fill layer 251a, and a third gap-fill layer 253a on the second gap-fill layer 252a.

The contact conductive layer 240 may cover a side surface and a bottom surface of a contact hole (see 'H' in FIG. 7) formed in the first insulating layer 201, and may be disposed to partially fill the contact hole. The contact conductive layer 240 may include at least one of tungsten (W), aluminum (Al), copper (Cu), ruthenium (Ru), molybdenum (Mo), and cobalt (Co). A recess G may be formed in the contact conductive layer 240, and the recess G may correspond to a void or a seam formed in a process of depositing a conductive material layer in the contact hole.

The contact conductive layer 240 may have a first portion US1 portion of an upper surface in contact with the second conductive layer 270 and a second portion US2 of the upper surface in contact with the gap-fill pattern LS. The second portion US2 may extend from the first portion US1 and may be concave with respect to the substrate 101, and may correspond to the recess G. The first upper surface US1 may have a convex portion with respect to the substrate 101. However, the present inventive concepts are not limited thereto. In some example embodiments, the first upper surface US1 may be substantially flat. For example, the second upper surface US2 may have a 'U' shape or a 'V' shape, but is the present inventive concepts are not limited thereto. The gap-fill pattern LS may be disposed to fill the recess G, for example, may fill a space between the second portion US2 of the upper surface of the contact conductive layer 240 and the second conductive layer 270. The gap-fill pattern LS may have a concave upper surface S1 with respect to the substrate 101 by performing a strip process and an etching process. Accordingly, a lower surface profile of the second conductive layer 270 may also have a curvature along the concave upper surface S1.

The first gap-fill layer 251a may conformally cover the second portion US2. For example, the first gap-fill layer 251a may extend downwardly along a surface of the recess G and may have a concave shape with respect to the substrate 101. The third gap-fill layer 253a may be disposed in a central region of the recess G to have a concave shape with respect to the substrate 101. The second gap-fill layer 252a may be disposed between the first gap-fill layer 251a and the third gap-fill layer 253a and may conformally cover the first gap-fill layer 251a. At least one of the plurality of layers of the gap-fill pattern LS may be substantially conformally formed in the recess G. However, the present inventive concepts are not limited thereto, and at least one of the plurality of layers may be formed to have a greater thickness at a lower end according to a depth or shape of the recess G.

The first gap-fill layer 251a and the third gap-fill layer 253a may include a first insulating material that includes a metal element. The first insulating material may include a metal oxide and/or a metal nitride, and the metal element may include at least one of aluminum (Al), zirconium (Zr), hafnium (Hf), titanium (Ti), ruthenium (Ru), molybdenum (Mo), tungsten (W), copper (Cu), and cobalt (Co).

The first gap-fill layer 251a and the third gap-fill layer 253a may serve to stop an etching process, when an etching process for forming a second conductive layer 270, together with the first etch stop layer 251b and the second etch stop layer 253b. Further, the first gap-fill layer 251a and the third gap-fill layer 253a may serve to fill a recess G of the contact conductive layer 240, together with the second gap-fill layer 252a.

The second gap-fill layer 252a may be formed of a material having a relatively good step coverage and gap-fill characteristics, and may be formed of, for example, conformal SiOC low temperature (COLT). In an example embodiment, the second gap-fill layer 252a may include a second insulating material that includes a silicon element. The second insulating material may include, for example, at least one of SiCO, SiCN, SiCOH, and SiCON.

When a general chemical vapor deposition process or plasma-enhanced chemical vapor deposition is used, the second gap-fill layer 252a is not conformally formed in the recess G, and an upper region of the recess (G) is capped in a state in which a void (e.g., an empty space) is formed therein. In this case, a portion of the second gap-fill layer 252a above the recess G may have a shape vulnerable to penetration of a material used in a subsequent strip process, and as the subsequent process is performed, the contact conductive layer 240 may be damaged, and the second conductive layer 270 cannot be stably formed on the contact conductive layer 240. In the present inventive concepts, in order to conformally form the second gap-fill layer 252a in the recess G, for example, a chemical vapor deposition method or an atomic layer deposition method using a remote plasma source may be used. Accordingly, when the second gap-fill layer 252a is formed, the second gap-fill layer 252a may be conformally formed along a surface of the first gap-fill layer 251a so that no empty space is formed inside the recess G. and thus it is possible to mitigate or prevent damage to the contact conductive layer 240 by a material used in a subsequent strip process. In addition, the second gap-fill layer 252a may serve to mitigate of prevent moisture absorption into the contact conductive layer 240.

A barrier structure IB may be disposed between the second insulating layer 231 and the third insulating layer 261. The barrier structure IB may have a thickness lower than a thickness of the second insulating layer 231 and a thickness of the third insulating layer 261. The barrier structure IB may surround a lower region of a side surface of the second conductive layer 270. The barrier structure IB may be spaced apart from a gap-fill pattern LS of the contact structure CS. The barrier structure IB may include a first etch stop layer 251b on the second insulating layer 231, a barrier layer 252b on the first etch stop layer 251b, and a second etch stop layer 253b on the barrier layer 252b. Each of the first and second etch stop layers 251b and 253b and the barrier layer 252b of the barrier structure IB may be substantially conformal.

The first etch stop layer 251b may have a first thickness t1, the barrier layer 252b may have a second thickness t2, and the second etch stop layer 253b may have a third thickness t3. The second thickness t2 may be thicker than at least one of the first thickness t1 and the third thickness t3. In an example embodiment, the first thickness t1 may be in a range from about 10 Å to about 30 Å, the second thickness t2 may be in a range from about 30 Å to about 80 Å, and the third thickness t3 may be in a range from about 10 Å to about 40 Å.

The first etch stop layer 251b and the second etch stop layer 253b may include the same material as the first insulating material. The barrier layer 252b may include the same material as the second insulating material.

The third insulating layer 261 may be disposed on the second insulating layer 231, and may cover a barrier structure IB. The third insulating layer 261 may cover a side surface of the second conductive layer 270, together with the barrier structure IB. The third insulating layer 261 may be formed of a silicon oxide or a low-k insulating material layer, and may be formed of the same material as the material constituting the first insulating layer 201.

The second conductive layer 270 may be disposed on a contact structure CS. The second conductive layer 270 may include a first portion in contact with a first portion US1 of the upper surface of the contact conductive layer 240 and a second portion in contact with an upper surface of the second insulating layer 231, wherein the first portion may be disposed at a level higher than the second portion. The first portion US1 of the upper surface of the contact conductive layer 240 including a convex portion with respect to the substrate 101 may contact the first portion of the second conductive layer 270. The second conductive layer 270 may have, for example, a line shape extending in an X direction, but is the present inventive concepts are not limited thereto, and may have a line shape extending in a Y direction. The second conductive layer 270 may penetrate through the third insulating layer 261 and the barrier structure IB to be directly connected to an upper portion of the contact structure CS. The second conductive layer 270 may directly contact the upper surface of the contact conductive layer 240 and may also directly contact the gap-fill pattern LS. The second conductive layer 270 may include a metallic material, for example, at least one of tungsten (W), aluminum (Al), copper (Cu), ruthenium (Ru), molybdenum (Mo), and cobalt (Co).

Figure 2:
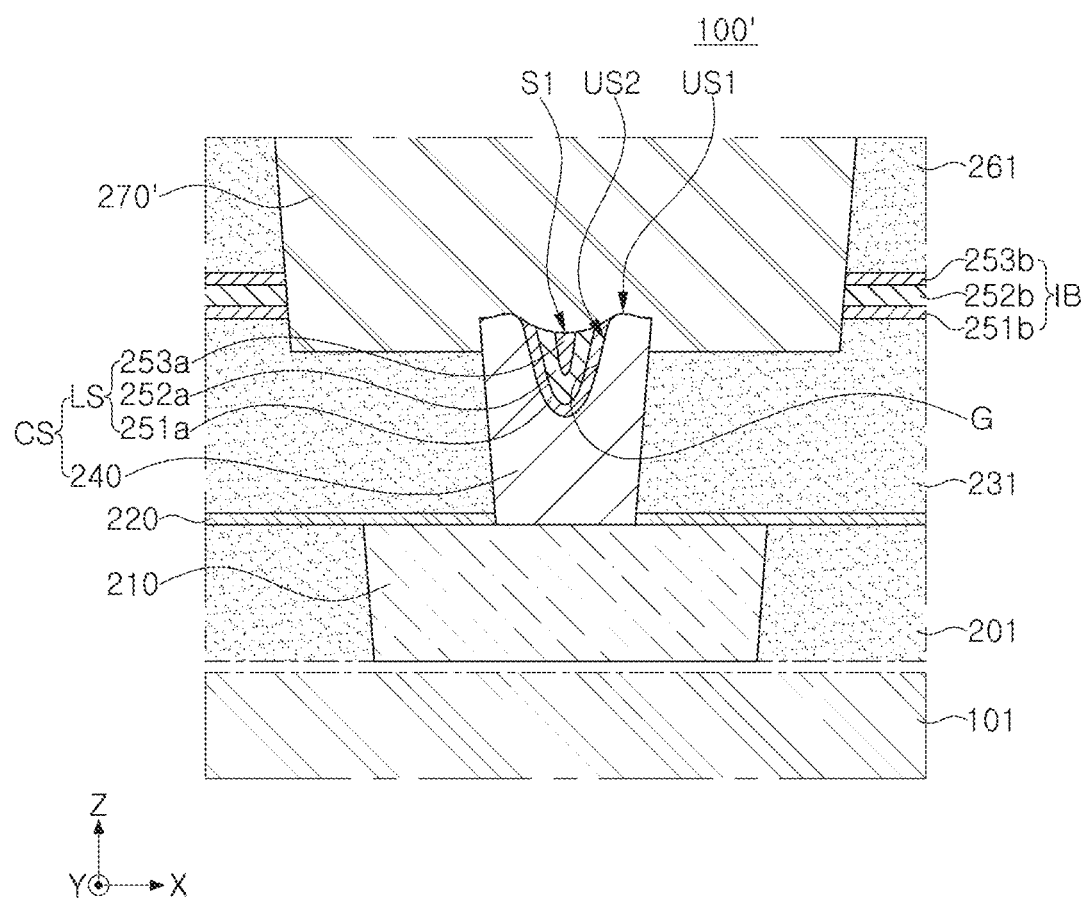
FIG. 2 is a cross-sectional view illustrating a semiconductor device according to some example embodiments.

FIG. 2 is a cross-sectional view illustrating a semiconductor device according to some example embodiments.

Referring to FIG. 2, in a semiconductor device 100', a lower surface of a second conductive layer 270' may be disposed at a level lower than a lower surface of a barrier structure IB. The lower surface of the second conductive layer 270' may include a first portion in contact with a first portion US1 of an upper surface of a contact conductive layer 240 and a second portion in contact with a second insulating layer 231, the second portion being disposed at a level lower than the lower surface of the barrier structure IB and contacting an upper region of a side surface of the contact conductive layer 240. A contact area between the second conductive layer 270' and the contact conductive layer 240 of a contact structure CS may increase. Accordingly, contact resistance between the contact conductive layer 240 and the second conductive layer 270' may be lowered, and the contact conductive layer 240 and the second conductive layer 270' may be more stably connected during a process of manufacturing the semiconductor device.

Figure 3:
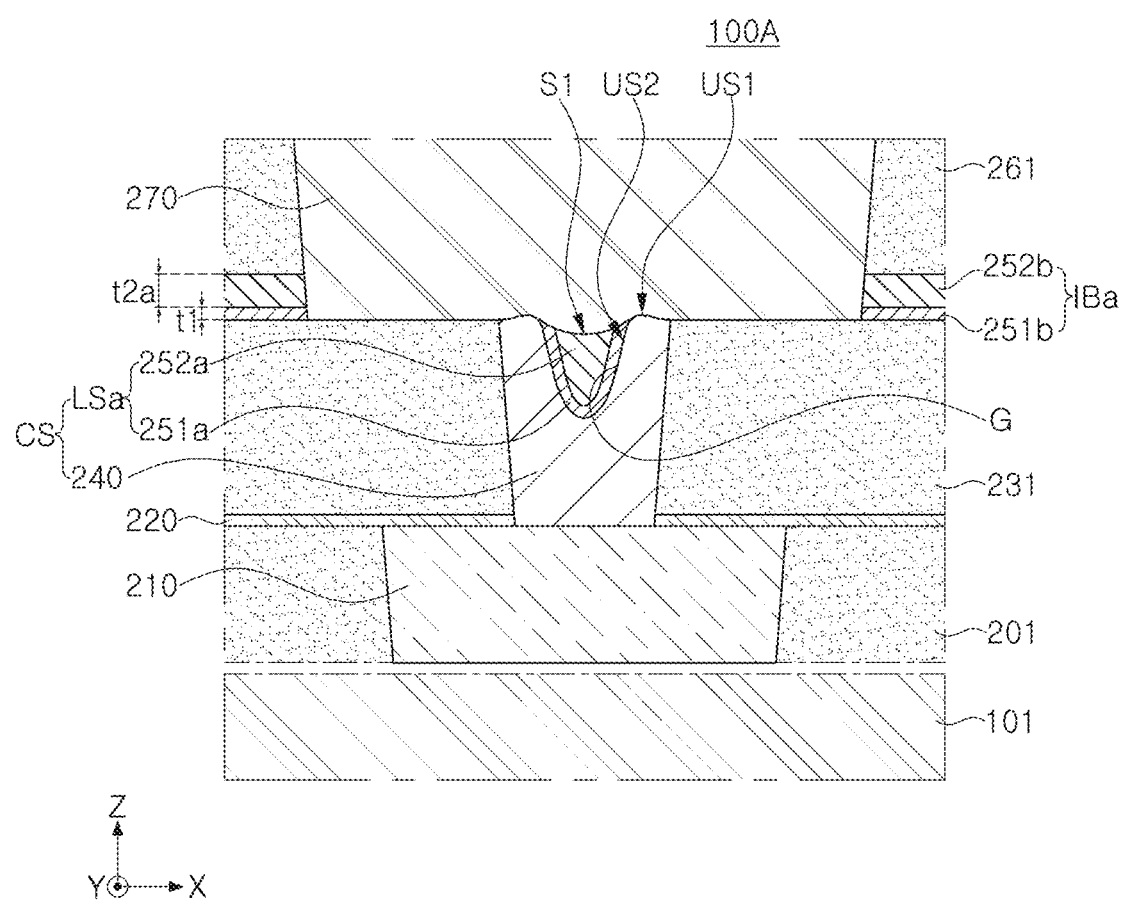
FIG. 3 is a cross-sectional view illustrating a semiconductor device according to some example embodiments.

FIG. 3 is a cross-sectional view illustrating a semiconductor device according to some example embodiments.

Referring to FIG. 3, in a semiconductor device 100A, a first gap-fill layer 251a and a second gap-fill layer 252a of a gap-fill pattern LSa of a contact structure CS may fill a recess G, and a third gap-fill layer 253a may be omitted. A barrier structure Iba may also include a first etch stop layer 251b and a barrier layer 252b, and a second etch stop layer 253b may be omitted. The barrier layer 252b may have a second thickness t2a that is thicker than a first thickness t1 of the first etch stop layer 251b. In order to completely fill the recess G, the barrier layer 252b may be formed to be thicker than the thickness t2 of the previous example embodiment.

Figure 4:
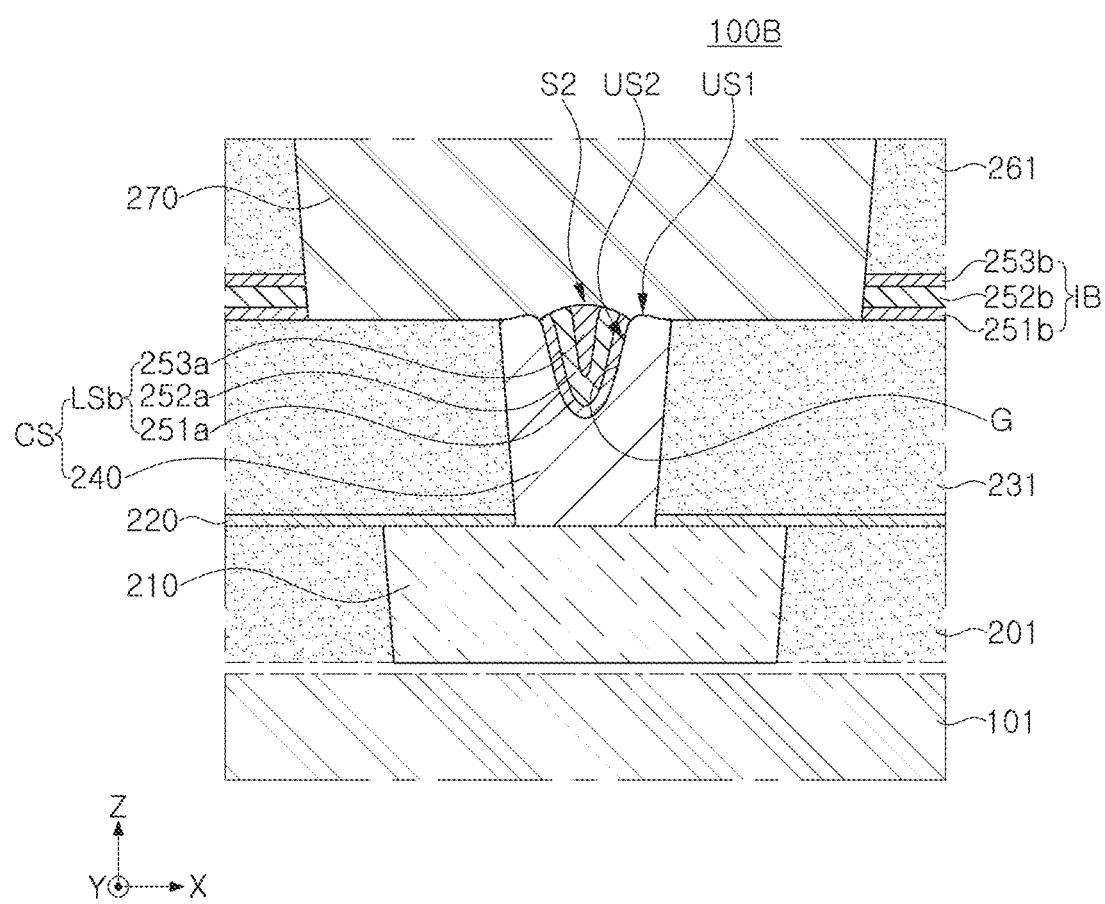
FIG. 4 is a cross-sectional view illustrating a semiconductor device according to some example embodiments.

FIG. 4 is a cross-sectional view illustrating a semiconductor device according to some example embodiments.

Referring to FIG. 4, in a semiconductor device 100B, a gap-fill pattern LSb may have a convex upper surface S2 with respect to the substrate 101, by performing a strip process and an etching process. Accordingly, a lower surface profile of the second conductive layer 270 may also have a curvature along the upper surface S2. A shape of an upper surface of the gap-fill pattern LSb or a level of an upper end of each layer may be variously changed as a strip process and an etching process are performed.

Figure 5:
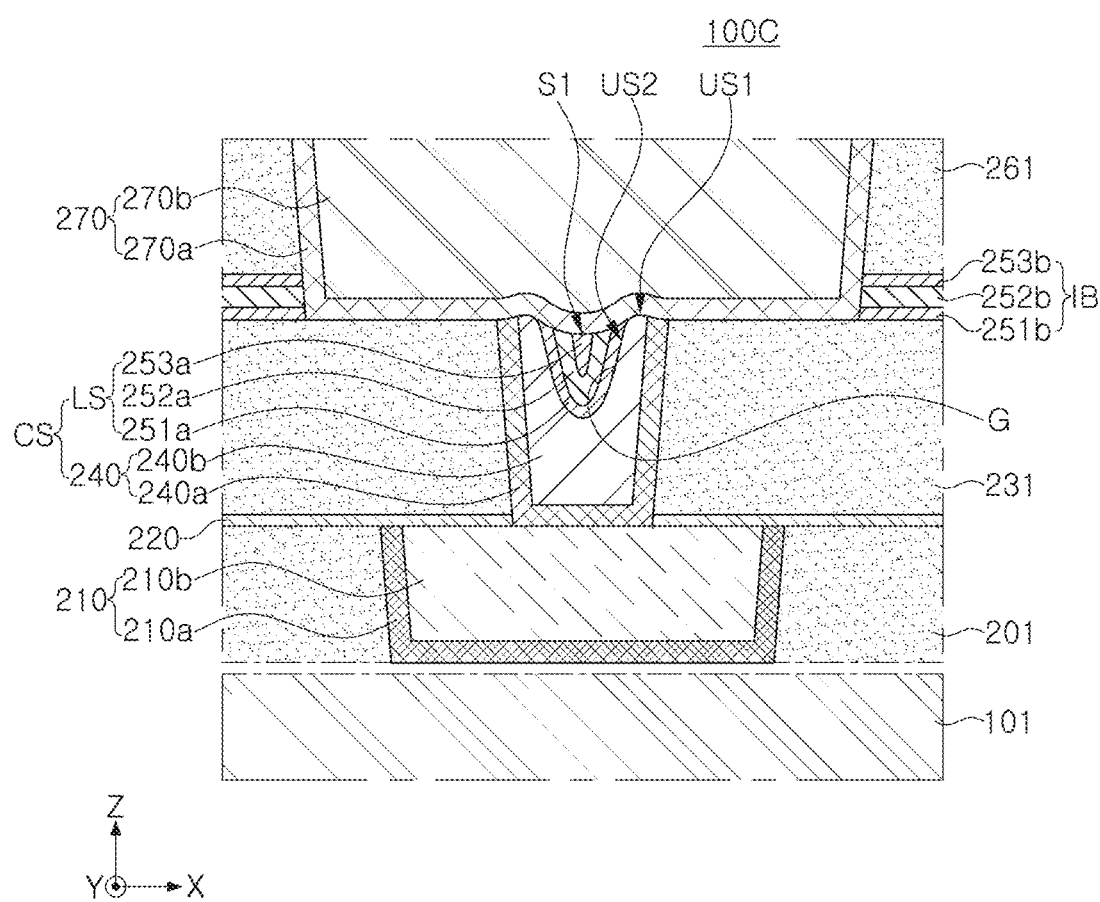
FIG. 5 is a cross-sectional view illustrating a semiconductor device according to example embodiments.

FIG. 5 is a cross-sectional view illustrating a semiconductor device according to some example embodiments.

Referring to FIG. 5, in a semiconductor device 100C, a first conductive layer 210 may include a first barrier layer 210a and a first metal layer 210b, side surfaces and a lower surface of which are surrounded by the first barrier layer 210a, a contact conductive layer 240 may include a contact barrier layer 240a, and a contact metal layer 240b, side surfaces and a lower surface of which are surrounded by the first barrier layer 210a, and a second conductive layer 270 may include a second barrier layer 270a and a second metal layer 270b, side surfaces and a lower surface of which are surrounded by the second barrier layer 270a. Each of the first and second barrier layers 210a and 270a and the contact barrier layer 240a may include at least one of titanium (Ti), titanium nitride (TiN), tantalum (Ta), and tantalum nitride (TaN). The first and second metal layers 210b and 270b and the contact metal layer 240b may include at least one of tungsten (W), aluminum (Al), copper (Cu), ruthenium (Ru), molybdenum (Mo), and cobalt (Co).

Figure 6:
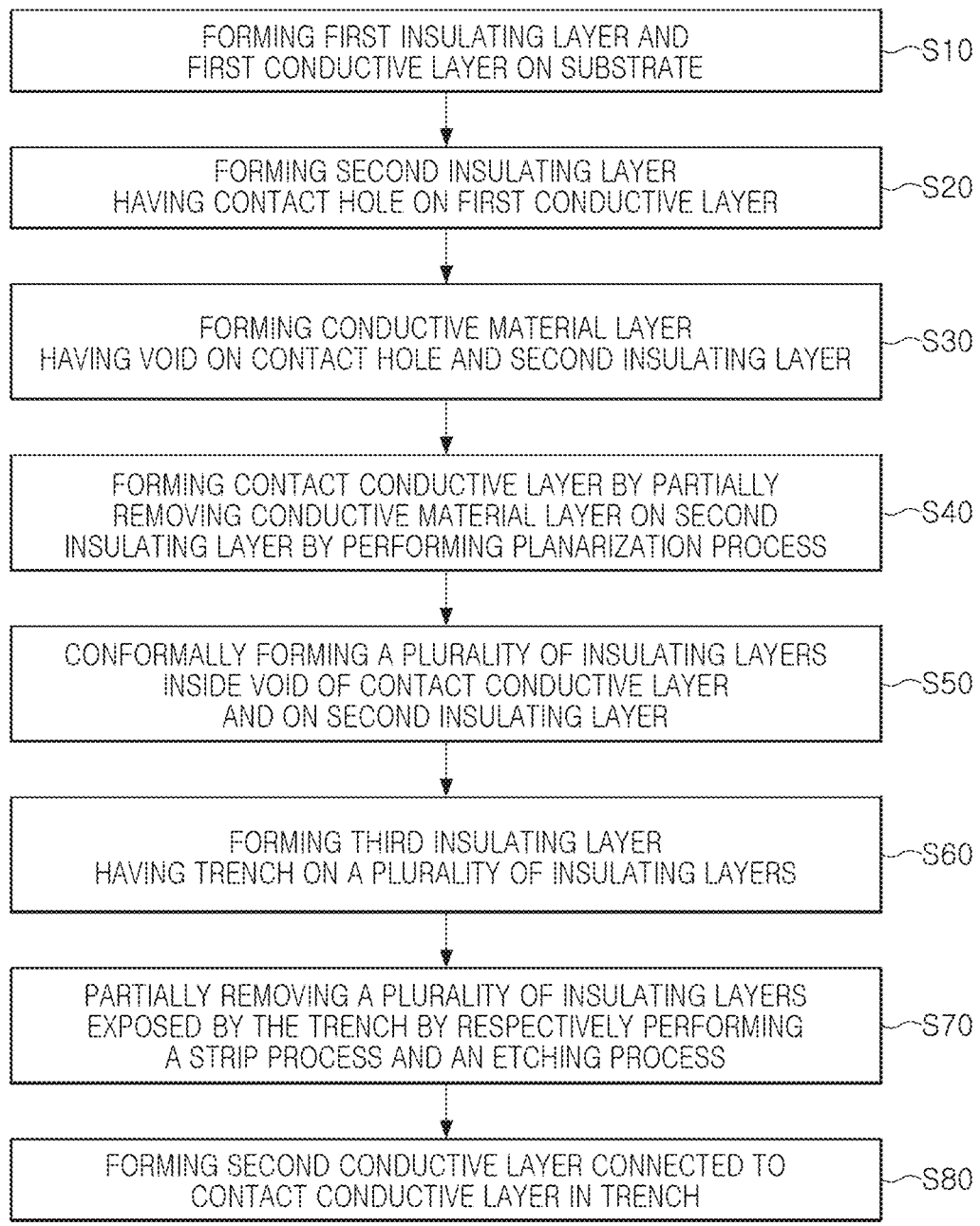
FIG. 6 is a flowchart illustrating a method of manufacturing a semiconductor device according to some example embodiments.

FIG. 6 is a flowchart illustrating a method of manufacturing a semiconductor device according to some example embodiments.

FIGS. 7 to 14 are views illustrating a process sequence in order to explain a method of manufacturing a semiconductor device according to some example embodiments.

Figure 7:
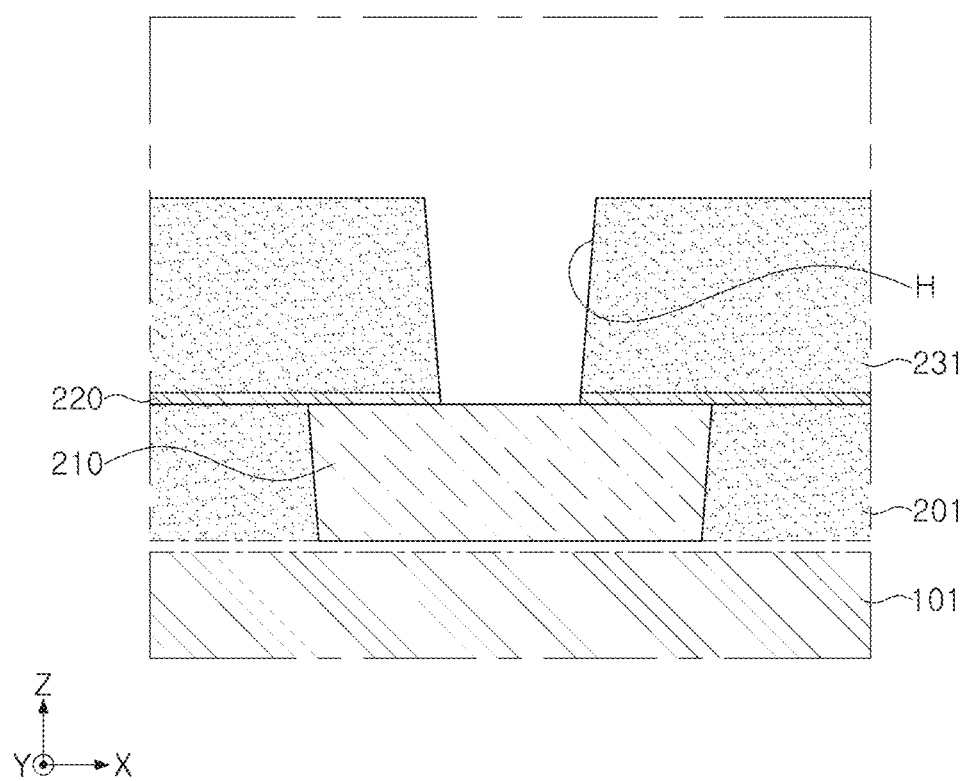
FIGS. 7 to 14 are diagrams illustrating a process sequence in order to explain a method of manufacturing a semiconductor device according to some example embodiments.

Referring to FIGS. 6 and 7, a first insulating layer 201 and a first conductive layer 210 may be formed on a substrate 101 (S10), and a second insulating layer 231 having a contact hole H may be formed on the first conductive layer 210 (S20).

Before forming the first insulating layer 201 and the first conductive layer 210, transistors may be formed on the substrate 101. The transistors may be formed by a front end of line (FEOL) process, and may be formed in an omitted region between the substrate 101 and the first insulating layer 201.

After the first insulating layer 201 is patterned and filled with a conductive material, a planarization process may be performed to form a first conductive layer 210. After the first conductive layer 210 is formed, a lower etch stop layer 220 may be formed on the first insulating layer 201 and the first conductive layer 210. The lower etch stop layer 220 may be conformally formed, and may serve to stop an etching process for forming a contact hole H. The lower etch stop layer 220 may be formed by depositing one or a plurality of insulating layers.

A second insulating layer 231 may be formed on the lower etch stop layer 220 and patterned to form a contact hole H penetrating through the second insulating layer 231. A portion of the lower etch stop layer 220 may also be partially removed from a lower portion of the contact hole H to expose a portion of an upper surface of the first conductive layer 210.

Figure 8:
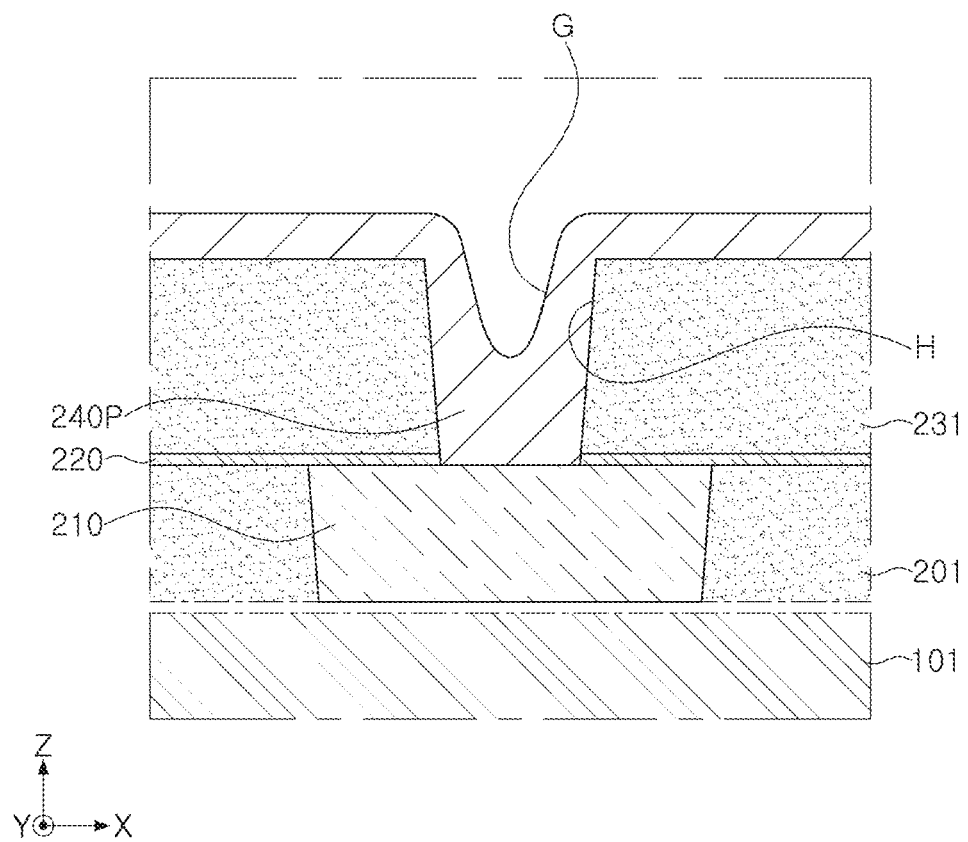

Referring to FIGS. 6 and 8, a conductive material layer 240P having a void G may be formed on the contact hole H and the second insulating layer 231 (S30).

The conductive material layer 240P may extend along an upper surface of the second insulating layer 231, and may be bent downwardly along the contact hole H to contact the upper surface of the first conductive layer 210. As a pattern of the semiconductor device is miniaturized, a size of the contact hole H becomes smaller, the conductive material layer 240P may not completely fill the contact hole H, and a void G, a boundary of which is concave with respect to the upper surface of the second insulating layer 231 (or with respect to the substrate 101), may be formed. A thickness of the conductive material layer 240P may be thickly formed below the void G, but the present inventive concepts are not limited thereto.

Figure 9:
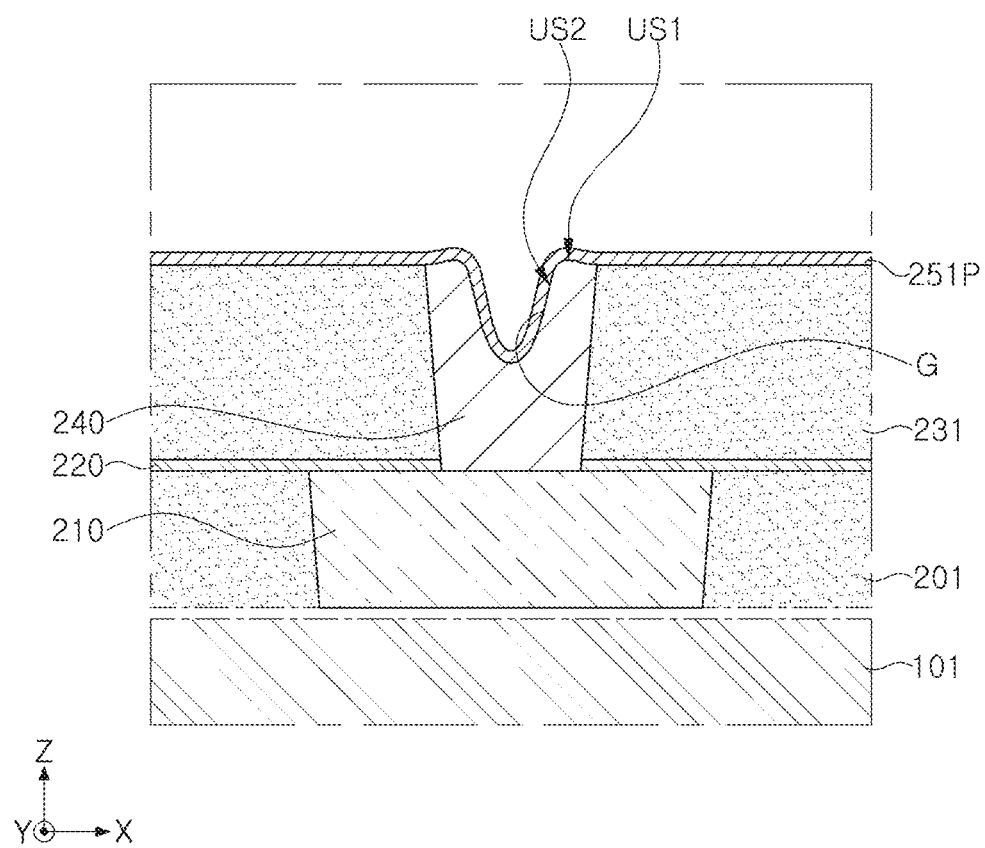
Figure 11:
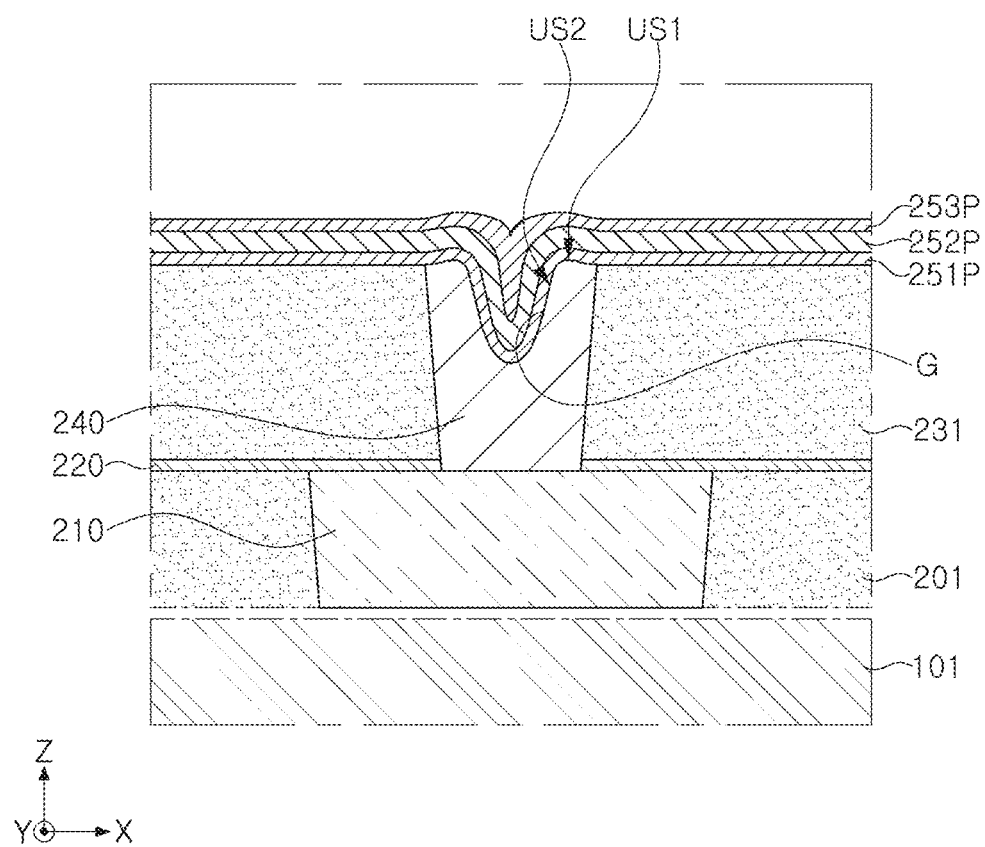

Referring to FIGS. 6, 9, and 11, a planarization process may be performed to partially remove the conductive material layer 240P on the second insulating layer 231 to form a contact conductive layer 240 (S40), and a plurality of insulating layers may be conformally formed inside the void G of the conductive layer 240 and on the second insulating layer 231 (S50).

First, the conductive material layer 240P on the second insulating layer 231 may be partially removed by a planarization process, so that a contact conductive layer 240 inside the contact hole H may be formed. An upper surface of the second insulating layer 231 may be exposed by the planarization process. A void G may remain in the contact conductive layer 240, and a first portion US1 of an upper surface of the contact conductive layer 240 having a convex surface (with respect to the substrate 101) protruding above the upper surface of the second insulating layer 231 may be formed around the void G. A surface of the void G may correspond to the second portion US2 of the upper surface of the contact conductive layer 240 extends from the first portion US1 of the upper surface of the contact conductive layer and has a concave shape with respect to the substrate 101.

Figure 10:
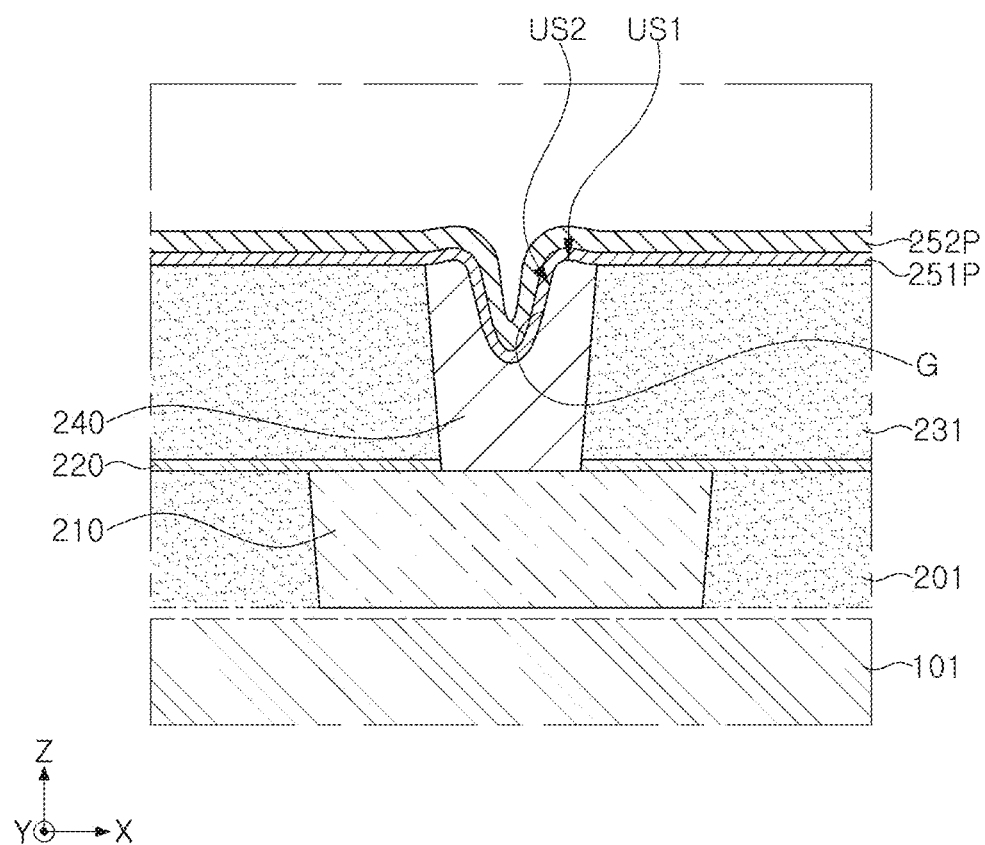

Referring to FIG. 9, a first layer 251P may be conformally formed inside the void G of the contact conductive layer 240 and on the second insulating layer 231. The first layer 251P may conformally cover the first portion US1 and the second portion US2 of the upper surface of the contact conductive layer 240. Referring to FIG. 10, a second layer 252P may be conformally formed on the first layer 251P. Referring to FIG. 11, a third layer 253P may be conformally formed on the second layer 252P. The first to third layers 251P, 252P, and 253P may be formed by using a chemical vapor deposition process, an atomic layer deposition process, a chemical vapor deposition method using a remote plasma source, or an atomic layer deposition method. For example, the first and third layers 251P and 253P including metal oxide and/or metal nitride may be formed using an atomic layer deposition process, and the second layer 252P including an insulating material including a silicon element may be formed using a chemical vapor deposition process using a remote plasma source or an atomic layer deposition process. At least a portion of the plurality of insulating layers (e.g., the first layer 251P, the second layer 252P, and the third layer 253P) may be formed to fill the void G.

Figure 12:
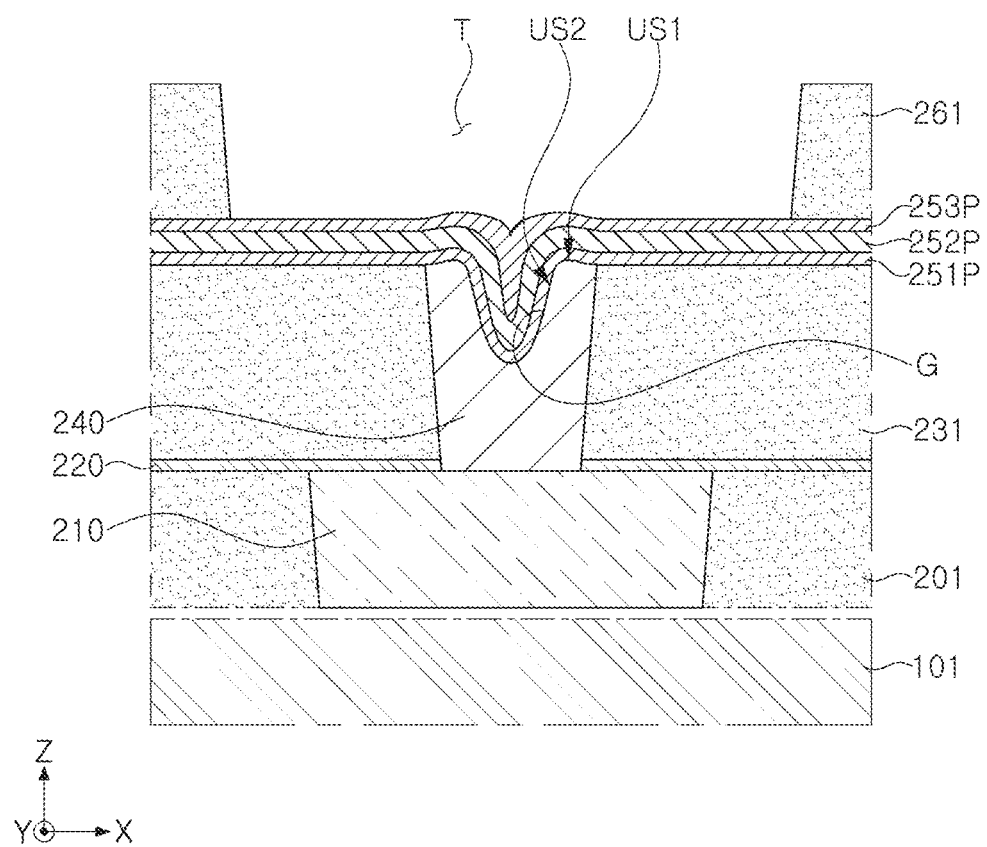

Referring to FIGS. 6 and 12, a third insulating layer 261 having a trench T may be formed on the plurality of insulating layers (S60).

A third insulating layer 261 may be formed on the plurality of insulating layers and patterned to form a trench T penetrating through the third insulating layer 261. A third layer 253P may be partially exposed below the trench T.

Figure 13:
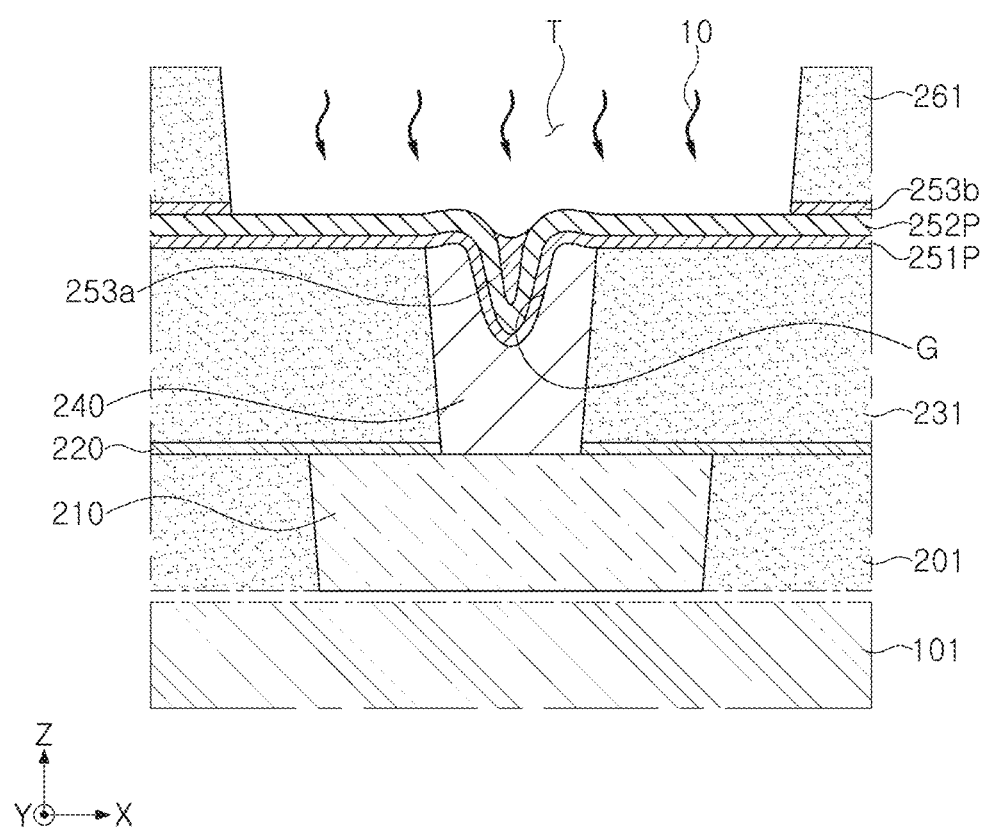
Figure 14:
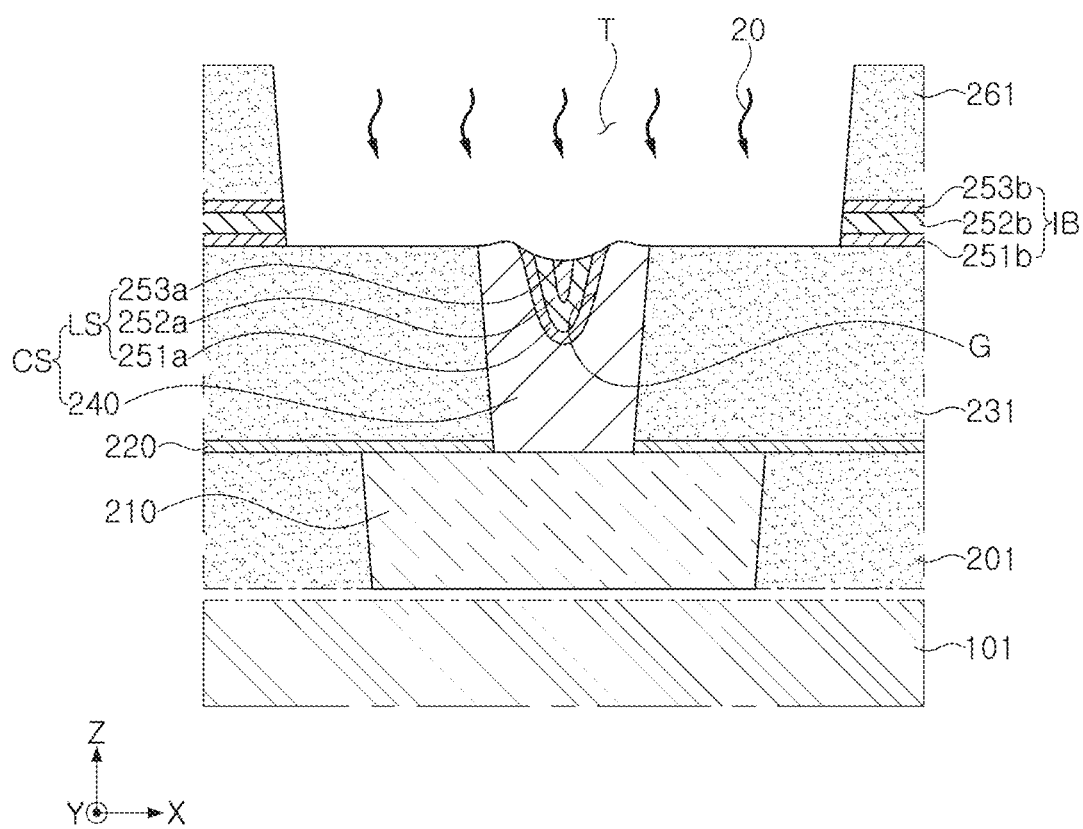

Referring to FIGS. 6, 13, and 14, the plurality of insulating layers exposed to the trench T may be partially removed by performing a strip process and an etching process, respectively (S70).

First, referring to FIG. 13, the third layer 253P exposed by the trench T may be partially removed by performing a first strip process 10. By the first strip process 10, a portion of the third layer 253P may remain on the void G to form a third gap-fill layer 253a, and a portion of the third layer 253P may remain on a second insulating layer 231 to form a second etch stop layer 253b. A hard mask pattern (not shown) on the third insulating layer 261 may also be removed by the first strip process 10. In this operation, when the third layer 253P is removed, the conformal second layer 252P may block or prevent a material used in the first strip process 10 from penetrating into the void G.

Referring to FIG. 14, the second layer 252P and the first layer 251P may be partially removed through a subsequent process 20. The subsequent process 20 may include at least one etching process and at least one strip process. Through the subsequent process 20, a portion of the second layer 252P may remain on the void G to form a second gap-fill layer 252a, and a portion of the second layer 252P may remain on the second insulating layer 231 to form a barrier layer 252b. Through the subsequent process 20, a portion of the first layer 251P may remain on the void G to form a first gap-fill layer 251a, and a portion of the first layer 251P may remain on the second insulating layer 231 to form a first etch stop layer 251b. Accordingly, a gap-fill pattern LS including the first gap-fill layer 251a, the second gap-fill layer 252a, and the third gap-fill layer 253a may be formed in the void G, and a barrier structure IB including a first etch stop layer 251b, a barrier layer 252b, and a second etch stop layer 253b may be formed between a second insulating layer 231 and a third insulating layer 261.

In some example embodiments, an upper region of the second insulating layer 231 may be partially removed while the subsequent process 20 is performed. In this case, an upper region of a side surface of a contact conductive layer 240 may be exposed.

Next, referring to FIGS. 6 and 1 together, a second conductive layer 270 connected to the contact conductive layer 240 may be formed in a trench T (S80). The second conductive layer 270 may be formed by filling the trench T with a conductive material, and the second conductive layer 270 may be directly connected to the contact conductive layer 240 and the gap-fill pattern LS. Accordingly, the semiconductor device 100 of FIG. 1 may be manufactured.

As set forth above, according to some example embodiments of the present inventive concepts, by forming a gap-fill pattern including a plurality of layers in a void or a recess of a contact conductive layer, the contact conductive layer may be protected from a material used in a subsequent process, so that a semiconductor device with improved reliability may be provided.

The various and advantageous advantages and effects of the present inventive concepts are not limited to the above description, but may be easily understood from the above description of the specific example embodiments of the present inventive concepts.

While some example embodiments have been shown and described above, it will be apparent to those skilled in the art that modifications and variations could be made without departing from the scope of the present inventive concepts as defined by the appended claims.

What is claimed is:

1. A semiconductor device, comprising:
a first conductive layer on a substrate;
a second conductive layer on the first conductive layer;
a contact structure between the first conductive layer and the second conductive layer; and
a barrier structure surrounding a lower region of a side surface of the second conductive layer, wherein
the contact structure includes a contact conductive layer and a gap-fill pattern, the contact conductive layer having an upper surface that includes a first portion in contact with the second conductive layer and a second portion extending from the first portion of the upper surface and being concave with respect to the substrate, the second portion being at a central position of the contact conductive layer in a horizontal direction, the gap-fill pattern filling a space between the second portion of the upper surface of the contact conductive layer and the second conductive layer, the gap-fill pattern including a plurality of layers,
at least one of the plurality of layers of the gap-fill pattern conformally covers the second portion of the upper surface of the contact conductive layer,
the plurality of layers of the gap-fill pattern include a first gap-fill layer and a second gap-fill layer, the first gap-fill layer including a first insulating material that includes a metal element, the second gap-fill layer including a second insulating material that includes a silicon element,
the barrier structure includes a first etch stop layer and a barrier layer, the first etch stop layer including a same material as the first insulating material, the barrier layer including a same material as the second insulating material and
the gap-fill pattern and the barrier structure are separated from each other by a portion of the second conductive layer.

2. The semiconductor device of claim 1, wherein
the first gap-fill layer conformally covers the second portion of the upper surface of the contact conductive layer, and
the second gap-fill layer conformally covers the first gap-fill layer.

3. The semiconductor device of claim 1, wherein
the first portion of the upper surface of the contact conductive layer has a convex portion with respect to the substrate, and
the gap-fill pattern is in contact with the second portion of the upper surface of the contact conductive layer, and has a convex shape with respect to the substrate.

4. The semiconductor device of claim 1, wherein an upper surface of the gap-fill pattern has a concave shape or a convex shape with respect to the substrate.

5. The semiconductor device of claim 1, wherein the second insulating material comprises at least one of SiCO, SiCN, SiCOH, and SiCON.

6. The semiconductor device of claim 1, wherein the metal element comprises at least one of aluminum (Al), zirconium (Zr), hafnium (Hf), titanium (Ti), ruthenium (Ru), molybdenum (Mo), tungsten (W), copper (Cu), and cobalt (Co).

7. The semiconductor device of claim 1, wherein
the barrier layer is on the first etch stop layer,
the second gap-fill layer is on the first gap-fill layer,
the barrier structure further comprises a second etch stop layer on the barrier layer,
the gap-fill pattern further comprises a third gap-fill layer on the second gap-fill layer, and
the third gap-fill layer and the second etch stop layer comprise a same material.

8. The semiconductor device of claim 7, wherein
the first etch stop layer has a first thickness, the barrier layer has a second thickness, and the second etch stop layer has a third thickness, and
the second thickness is thicker than at least one of the first thickness and the third thickness.

9. The semiconductor device of claim 8, wherein
the first thickness is in a range from 10 Å to 30 Å,
the second thickness is in a range from 30 Å to 80 Å, and
the third thickness is in a range from 10 Å to 40 Å.

10. The semiconductor device of claim 1, wherein the second portion of the upper surface has a 'U' shape or a 'V' shape.

11. The semiconductor device of claim 1, wherein
the contact conductive layer comprises a contact barrier layer and a contact metal layer,
the contact barrier layer covers lower and side surfaces of the contact metal layer, and
the contact metal layer comprises at least one of tungsten (W), aluminum (Al), copper (Cu), ruthenium (Ru), molybdenum (Mo), and cobalt (Co).

12. A semiconductor device, comprising:
an insulating layer on a substrate, and having a contact hole;
a contact structure in the contact hole of the insulating layer;
an upper conductive layer on the contact structure; and
a barrier structure in contact with a lower region of a side surface of the upper conductive layer and spaced apart from the contact structure, wherein
the contact structure includes a contact conductive layer and a gap-fill pattern, the contact conductive layer having a recess being concave with respect to the substrate, the recess being at a central position of the contact conductive layer in a horizontal direction, an upper surface of the contact conductive layer being in contact with the upper conductive layer, the gap-fill pattern filling the recess of the contact conductive layer and being in contact with the upper conductive layer, the gap-fill pattern including a plurality of layers,
a lower surface of the upper conductive layer includes a first portion in contact with the upper surface of the contact conductive layer and a second portion in contact with an upper surface of the insulating layer,
the first portion is at a higher level than the second portion,
the plurality of layers of the gap-fill pattern include a first gap-fill layer and a second gap-fill layer, the first gap-fill layer including a first insulating material that includes a metal element, the second gap-fill layer including a second insulating material that includes a silicon element,
the barrier structure includes a first etch stop layer and a barrier layer, the first etch stop layer including a same material as the first insulating material, the barrier layer including a same material as the second insulating material, and
the gap-fill pattern and the barrier structure are separated from each other by a portion of the upper conductive layer.

13. The semiconductor device of claim 12, wherein
the second gap-fill layer is on the first gap-fill layer, and
the gap-fill pattern further comprises a third gap-fill layer on the second gap-fill layer.

14. The semiconductor device of claim 13, wherein
the first gap-fill layer extends downwardly along a surface of the recess,
the third gap-fill layer is in a central region of the recess and has a convex shape with respect to the substrate, and
the second gap-fill layer is between the first gap-fill layer and the third gap-fill layer.

15. The semiconductor device of claim 12, wherein the upper surface of the contact conductive layer has a convex portion in contact with the first portion.

16. The semiconductor device of claim 12, wherein
the second portion of the upper conductive layer is at a lower level than a lower surface of the barrier structure, and
the second portion of the upper conductive layer is in contact with an upper region of a side surface of the contact conductive layer.

17. The semiconductor device of claim 12, wherein
the second insulating material comprises at least one of SiCO, SiCN, SiCOH, and SiCON, and
the metal element comprises at least one of aluminum (Al), zirconium (Zr), hafnium (Hf), titanium (Ti), ruthenium (Ru), molybdenum (Mo), tungsten (W), copper (Cu), and cobalt (Co).

18. A semiconductor device, comprising:
a first insulating layer on a substrate;
a first conductive layer penetrating through the first insulating layer;
a second insulating layer on the first insulating layer and the first conductive layer;
a contact structure directly connected to the first conductive layer and penetrating through the second insulating layer;
a third insulating layer on the second insulating layer and the contact structure;
a second conductive layer directly connected to the contact structure and penetrating through the third insulating layer; and
a barrier structure between the second insulating layer and the third insulating layer, in contact with a lower region of a side surface of the second conductive layer, and spaced apart from the contact structure, wherein
the contact structure includes a contact conductive layer and a gap-fill pattern, the contact conductive layer having an upper surface that includes a first portion in contact with the second conductive layer and a second portion extending from the first portion of the upper surface and being concave with respect to the substrate, the second portion being at a central position of the contact conductive layer in a horizontal direction, the gap-fill pattern filling a space between the second portion of the upper surface of the contact conductive layer and the second conductive layer, the gap-fill pattern including a plurality of layers,
the plurality of layers of the gap-fill pattern include a first gap-fill layer and a second gap-fill layer, the first gap-fill layer including a first insulating material that includes a metal element, the second gap-fill layer including a second insulating material that includes a silicon element, a third gap-fill layer including a same material as the first insulating material,
the barrier structure includes a first etch stop layer, a barrier layer and a second etch stop layer, the first etch stop layer including a same material as the first insulating material, the barrier layer including a same material as the second insulating material, the second etch stop layer including a same material as the first insulating material,
the first gap-fill layer conformally covers the second portion of the upper surface of the contact conductive layer,
the second gap-fill layer conformally covers the first gap-fill layer,
the second insulating material includes at least one of SiCO, SiCN, SiCOH, and SiCON,
the metal element includes at least one of aluminum (Al), zirconium (Zr), hafnium (Hf), titanium (Ti), ruthenium (Ru), molybdenum (Mo), tungsten (W), copper (Cu), and cobalt (Co), and
the gap-fill pattern and the barrier structure are separated from each other by a portion of the second conductive layer.

19. The semiconductor device of claim 18, wherein
the first portion of the upper surface of the contact conductive layer has a convex portion with respect to the substrate, and
an upper surface of the gap-fill pattern has a concave shape with respect to the substrate.

* * * * *